United States Patent [19]

Baik

[11] Patent Number: 4,961,009

[45] Date of Patent: Oct. 2, 1990

[54] CURRENT-VOLTAGE CONVERTING CIRCUIT UTILIZING CMOS-TYPE TRANSISTOR

[75] Inventor: Woo H. Baik, Seoul, Rep. of Korea

[73] Assignee: Goldstar Semiconductor, Ltd., Seoul, Rep. of Korea

[21] Appl. No.: 369,038

[22] Filed: Jun. 20, 1989

[30] Foreign Application Priority Data

Jun. 29, 1988 [KR] Rep. of Korea ............... 10253/1988

[51] Int. Cl.[5] ...................... H03K 3/027; H03K 3/013; H03K 17/687; H03K 3/01

[52] U.S. Cl. .................................. 307/296.8; 307/475; 307/558; 307/585; 330/228; 323/315

[58] Field of Search .................. 307/296.1, 296.8, 360, 307/263, 475, 558, 451, 585, 472, 443; 330/252, 253, 254, 261, 288; 323/375, 316, 317

[56] References Cited

U.S. PATENT DOCUMENTS

| | | | |
|---|---|---|---|
| 4,453,094 | 6/1984 | Peil et al. | 307/296.8 X |
| 4,700,125 | 10/1987 | Takata et al. | 307/296.8 X |
| 4,745,395 | 5/1988 | Robinson | 323/315 X |
| 4,766,415 | 8/1988 | Dielacher | 307/296.8 X |
| 4,800,339 | 1/1989 | Tanimoto et al. | 330/253 |
| 4,818,901 | 4/1989 | Young et al. | 323/315 X |

*Primary Examiner*—Stanley D. Miller
*Assistant Examiner*—David R. Bertelson
*Attorney, Agent, or Firm*—Brumbaugh, Graves, Donohue & Raymond

[57] ABSTRACT

A current-voltage converting circuit applicable to a linear integrated circuit of CMOS-type having a wide-ranged operational voltage, comprising a buffer circuit for buffering and amplifying a current being input to an input terminal; a gain circuit for outputting a voltage in proportion to the output voltage of the buffer circuit; and a current reference circuit constituted in a current mirror by P-channel transistors; N-channel transistors and a reference voltage and is adapted to supply a constant voltage to gates of P-channel transistors provided in the gain circuit.

1 Claim, 1 Drawing Sheet

CURRENT-VOLTAGE CONVERTING CIRCUIT UTILIZING CMOS-TYPE TRANSISTOR

BACKGROUND OF THE INVENTION

The present invention relates to a current-voltage converting circuit which converts an input current into a voltage in proportion thereto and applies the converted voltage to an integrated circuit as a drive voltage, and more particularly to a current-voltage converting circuit which is applicable directly to a linear integrated circuit of the CMOS-type which has a wide-ranged operational voltage for power source.

In an integrated circuit, there has been provided a current-voltage circuit for supplying a drive voltage by converting an input current into a voltage in proportion thereto.

However, since the conventional current-voltage converting circuit is constituted by use of a N-channel MOS transistor, a large amount of power loss occurs at the converting circuit and there has been a disadvantage in that the converting circuit is inapplicable directly to a CMOS-type integrated circuit.

SUMMARY OF THE INVENTION

Therefore, the object of the present invention is to provide a current-voltage converting circuit utilizing a CMOS-type transistor which is applicable directly to a CMOS-type linear integrated circuit having a wide-ranged operational voltage of a power source.

The object of the present invention is obtained by providing a buffer circuit which is composed of N-channel transistors and buffers and amplifies an input current, a gain circuit which is composed of P-channel transistors and N-channel transistors so as to have a current source load and outputs a voltage depending upon the output voltage of said buffer circuit, and a current reference circuit which is composed of P-channel transistors and N-channel transistors and supplies a gate input voltage to said gain circuit.

BRIEF DESCRIPTION OF THE DRAWINGS

The above and other objects, features and advantages of the present invention will become more apparent from the following detailed description taken in conjunction with the accompanying drawings, in which.

DETAILED DESCRIPTION OF THE INVENTION

Figure 1:
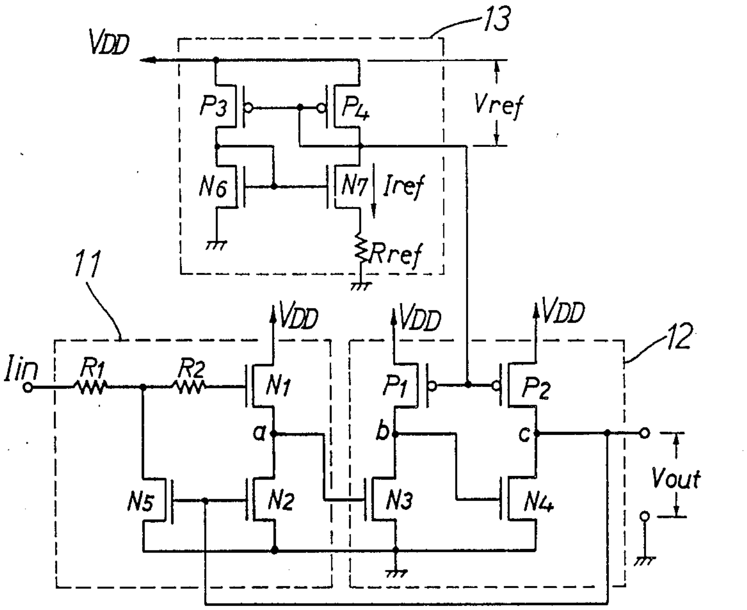
FIG. 1 is a circuit diagram of a current-voltage converting circuit according to the present invention.

As shown in FIG. 1, the current-voltage converting circuit according to the present invention is constituted with a buffer circuit 11 which is composed of resistors $R_1$ and $R_2$ and N-channel transistors $N_1$, $N_2$ and $N_5$ and buffers and amplifies a current being input to an input terminal $I_{in}$, a gain circuit 12 which is constructed in a 2-step inverter form so as to have a current source load by P-channel transistors $P_1$ and $P_2$ and N-channel transistors $N_3$ and $N_4$ and outputs a voltage depending upon the output voltage of said buffer circuit 11 and feedbacks the output voltage to gates of the N-channel transistors $N_2$ and $N_5$ of said buffer circuit 11, and a current reference circuit 13 which is constructed in a current mirror by P-channel transistors $P_3$ and $P_4$, N-channel transistors $N_6$ and $N_7$ and a reference resistor $R_{ref}$ and supplies a predetermined voltage to gates of the P-channel transistors $P_1$ and $P_2$ of said gain circuit 12.

The operation and effect of the current-voltage converting circuit as constructed above will now be described in detail.

When a current is applied via the input terminal $I_{in}$, the input current is applied through resistors $R_1$ and $R_2$ to a gate of the N-channel transistor $N_1$ to turn the transistor $N_1$ on.

Accordingly, a voltage depending upon the ratio of the N-channel transistors $N_1$ and $N_2$ is output from a connecting point a of the N-channel transistors $N_1$ and $N_2$. The output voltage of the connecting point a is applied to a gate of a N-channel transistor $N_3$ which is a first gain terminal of the gain circuit 12, thereby from a connecting point b of the N-channel transistor $N_3$ and P-channel transistor $P_1$ is output a voltage in reverse proportion to the voltage of the connecting point a. The output voltage of the connecting point b is applied to a gate of the N-channel transistor $N_4$ which is a second gain terminal, thereby from a connecting point c of the N-channel transistor $N_4$ and P-channel transistor $P_2$ is output a voltage in reverse proportion to the voltage of said connecting point b. Accordingly, the voltage of the connecting point a of the N-channel transistors $N_1$ and $N_2$ is in proportion to the amount of the current being input to the input terminal $I_{in}$, the voltage of the connecting point c of the P-channel transistor $P_2$ and N-channel transistor $N_4$ is in proportion to the voltage of the connecting point a, and thus the voltage $V_{out}$ being output from the gain circuit 12 is in proportion to the amount of the current being input to the input terminal $I_{in}$.

On the other hand, the output voltage $V_{out}$ of the gain circuit 12 is fedback to gates of the N-channel transistors $N_2$ and $N_5$ of the buffer circuit 11, thereby the gain circuit 12 operates to bring down its output voltage $V_{out}$ when the output voltage $V_{out}$ is high and it operates to raise its output voltage $V_{out}$ when the output voltage $V_{out}$ is low than the output voltage $V_{out}$ becomes stable.

Furthermore, the gate voltage of the P-channel transistors $P_1$ and $P_2$ of the gain circuit 12 is supplied uniformly by the current reference circuit 13.

That is to say, since the P-channel transistors $P_3$ and $P_4$ of the current reference circuit 13 are operated as a current mirror the reference current $I_{ref}$ passing through the N-channel transistor $N_7$ becomes uniform. At this time, not only the reference current $I_{ref}$ is uniform at all time irrespective of a power source voltage VDD, but the reference voltage $V_{ref}$ is uniform, so that a uniform voltage is supplied to the gates of the P-channel transistors $P_1$ and $P_2$ of the gain circuit 12.

Therefore, the voltage between the gate and source of the P-channel transistors $P_1$ and $P_2$ of the gain circuit 12 is always constant irrespective of the power source voltage VDD, and accordingly the output voltage $V_{out}$ of the gain circuit 12 is determined only by the amount of the current being input to the input terminal $I_{in}$ irrespective of the power source voltage VDD.

Figure 2:
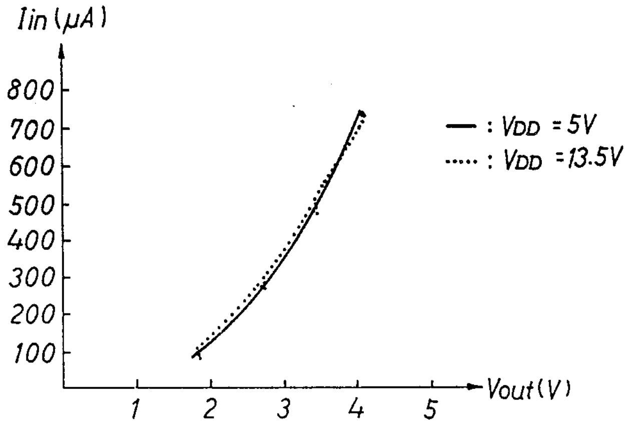
FIG. 2 is a graph showing the relations between an input current and an output voltage according to the present invention.

FIG. 2 shows the relations between the current being input to the input terminal $I_{in}$ as described above and the output voltage $V_{out}$ of the gain circuit 12.

As described above in detail, the present invention is advantageous in that since an output voltage in proportion to the amount of an input current can be obtained irrespective of a power source voltage, it is possible to control the output in relation only to the amount of an input current by being applied to a CMOS-type linear integrated circuit which is wide in operational voltage.

What is claimed is:

1. A current-voltage converting circuit utilizing a CMOS-type transistor, which comprises:

a buffer circuit (11) which is composed of resistors ($R_1$, $R_2$) and N-channel transistors ($N_1$,$N_2$,$N_5$) and buffers and amplifies a current being input to an input terminal ($I_{in}$);

a gain circuit (12) which is constituted in a 2-step inverter form so as to have a current source load by P-channel transistors ($P_1$,$P_2$) and N-channel transistors ($N_3$,$N_4$) and outputs a voltage in proportion to the output voltage of said buffer circuit (11) and feedbacks the output voltage to gates of N-channel transistors ($N_2$,$N_5$) of said buffer circuit (11); and a current reference circuit (13) which is constituted in a current mirror by P-channel transistors ($P_3$,$P_4$), N-channel transistors ($N_6$,$N_7$) and a reference voltage ($V_{ref}$) and supplies a constant voltage to gates of the P-channel transistors ($P_1$,$P_2$) of the gain circuit (12).

* * * * *